United States Patent
Jacunski et al.

(10) Patent No.: US 7,068,564 B2
(45) Date of Patent: Jun. 27, 2006

(54) TIMER LOCKOUT CIRCUIT FOR SYNCHRONOUS APPLICATIONS

(75) Inventors: Mark D Jacunski, Colchester, VT (US); Alan D Norris, Hinesburg, VT (US); Samuel K Weinstein, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 10/604,168

(22) Filed: Jun. 29, 2003

(65) Prior Publication Data

US 2004/0264289 A1    Dec. 30, 2004

(51) Int. Cl.
*G11C 8/00* (2006.01)

(52) U.S. Cl. .................. 365/233; 365/194; 365/203
(58) Field of Classification Search ................ 365/194, 365/203, 233
See application file for complete search history.

(56) References Cited

U.S. PATENT DOCUMENTS

| | | | |
|---|---|---|---|
| 6,353,573 B1* | 3/2002 | Koshikawa | 365/233 |
| 6,434,082 B1* | 8/2002 | Hovis et al. | 365/233 |
| 6,507,526 B1* | 1/2003 | Ohtake | 365/203 |
| 2003/0185075 A1* | 10/2003 | Park et al. | 365/203 |

* cited by examiner

*Primary Examiner*—Son Mai
(74) *Attorney, Agent, or Firm*—Schmeiser, Olsen & Watts; Anthony Canale

(57) ABSTRACT

A SDRAM mid a tinier lockout circuit. The SDRAM including: at least one bank of DRAM cells; the SDRAM operable to a first specification defined by a first clock frequency, a first write recovery time and a first time interval for precharge to row address strobe; and a circuit for programming the SDRAM operable to a second specification defined by a second clock frequency, a second write recovery time and a second time interval for precharge to row address strobe.

20 Claims, 4 Drawing Sheets

US 7,068,564 B2

TIMER LOCKOUT CIRCUIT FOR SYNCHRONOUS APPLICATIONS

BACKGROUND OF INVENTION

1. Field of the Invention

The present invention relates to the field of synchronous circuits; more specifically, it relates to a lockout timer for synchronous circuits and especially for synchronous dynamic random access memory circuits.

2. Background of the Invention

Generally synchronous circuits, such a synchronous dynamic random access memory (SDRAM) circuits are designed to run at a pre-determined clock speed and with specified minimum fixed timings between critical input/output (I/O) events. It would be cost-effective to design and build synchronous circuits that can run at more than one clock speed as well as meet more than one set of I/O event timing specifications.

SUMMARY OF INVENTION

A first aspect of the present invention is a timer lockout circuit comprising: a delay circuit for receiving and delaying a first timing signal; first circuit for receiving the first timing signal from the first delay circuit and for latching the first timing signal; programmable timing circuit for receiving the first timing signal from the first circuit and for delaying the first timing signal by a programmable time interval; a one-shot generator for receiving the first timing signal from the programmable timing circuit and for generating a set signal; a second circuit for receiving the set signal from the one-shot generator and for latching the set signal; a third circuit for receiving a second timing signal and for latching the second timing signal; a combinational logic circuit for receiving the set signal from the second circuit and for receiving the second timing signal from the third circuit and for generating a third timing signal; and a second delay circuit for receiving and delaying the third timing signal and for simultaneously resetting the first circuit, the second circuit and the third circuit after delaying the third timing signal.

A second aspect of the present invention is a timer lockout circuit comprising: first means for receiving a first timing signal from a first delay circuit and for latching the first timing signal; second means for receiving the first timing signal from the first means and for delaying the first timing signal by a programmable time interval; third means for receiving the first timing signal from the second means and for generating a set signal; fourth means for receiving the set signal from the third means and for latching the set signal; fifth means for receiving a second timing signal and for latching the second timing signal; sixth means for receiving the set signal from the fourth means and for receiving the second timing signal from the fifth means and for generating a third timing signal; and seventh means for simultaneously resetting the first means, the fourth means and the fifth means.

A third aspect of the present invention is a SDRAM comprising: at least one bank of DRAM cells; the SDRAM operable to a first write recovery time; a first circuit for programming the SDRAM operable to a second write recovery time; and a second circuit for delaying the start of a precharge command for a time interval equal to the first write recovery time when the SDRAM is operable to the second write recovery time.

A fourth aspect of the present invention is a SDRAM comprising: at least one bank of DRAM cells; the SDRAM operable to a first write recovery time; a first circuit for programming the SDRAM operable to a second write recovery time; and a second circuit for delaying the start of a precharge command for a time interval equal to the first write recovery time when the SDRAM is operable to the second write recovery time.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

While the present invention will be described using an SDRAM circuit as an example of a synchronous circuit to which the present invention is applicable and while a SDRAM according to the present invention is one aspect of the present invention, certain other aspects of the present invention are applicable to other synchronous circuits such as static RAMs, controllers and microprocessors.

Figure 1:
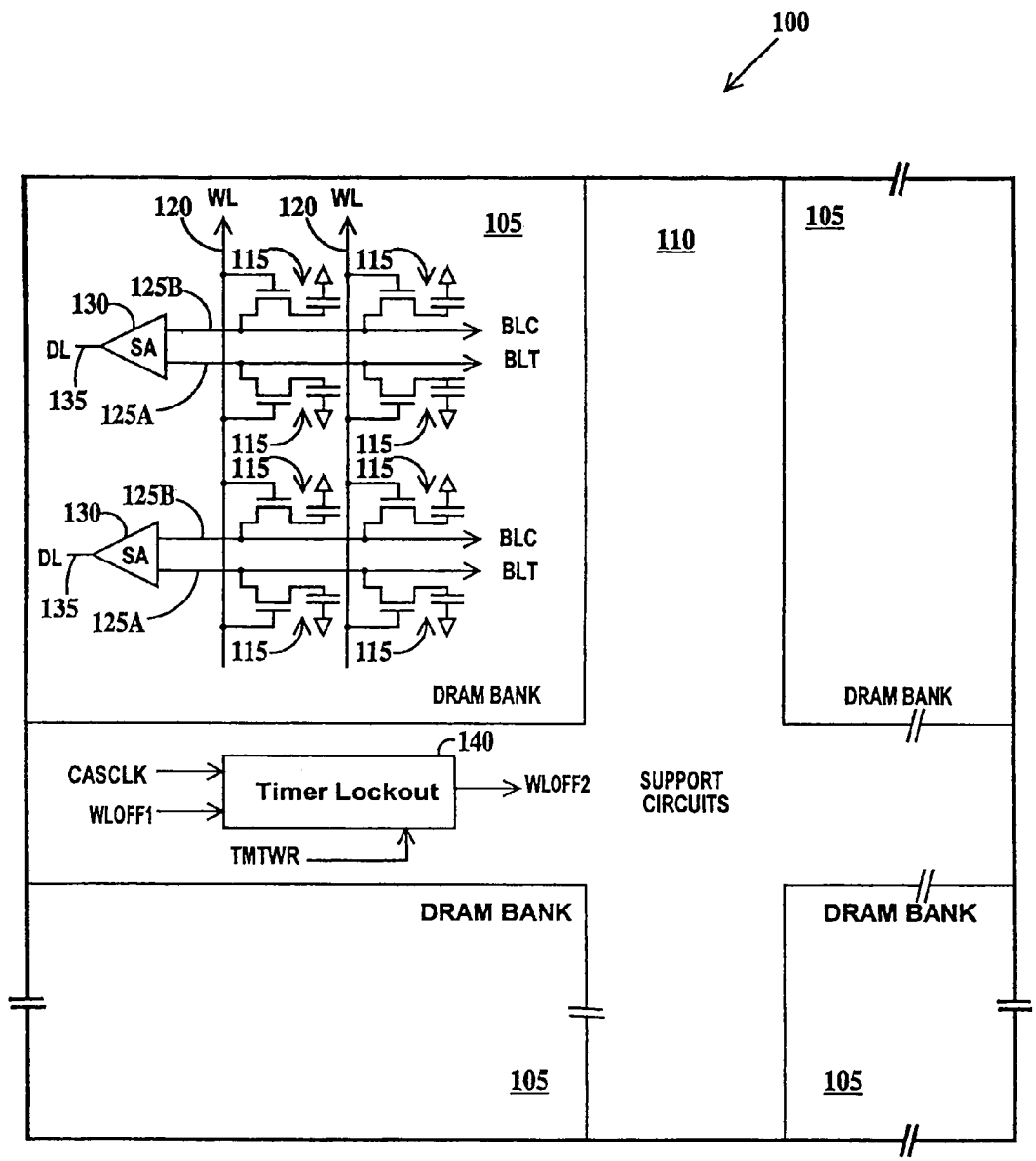
FIG. 1 is a schematic circuit diagram of an SDRAM circuit according to the present invention.

FIG. 1 is a schematic circuit diagram of an SDRAM circuit according to the present invention. In FIG. 1, an SDRAM 100 includes DRAM banks 105 and a support circuit region 110. DRAM banks 105 include a multiplicity of memory cells 115 arranged in rows and columns and accessible through word lines 120 connected to read, write and address circuits in support circuit region 110 and a multiplicity of bit lines true 125A and a multiplicity of bit lines complement 125B also connected to read, write and address circuits in the support region. Each bit line true 125A/bit line complement 125B bit line pair is connected to a sense amplifier 130. The output of sense amplifiers 130 are coupled to data lines 135.

A DRAM is written or read (after a bank is selected) by bringing a selected word line high to move the charge stored in all cells coupled to that wordline to the bit lines. The sense amplifiers amplify this small amount of charge. Bit lines must be precharged after a write prior to a read or the next write cycle. Writing, reading and precharging take finite amounts of time to accomplish. These times are reflected in the DRAM specifications in Table I which are typical examples of such specification.

TABLE I

| Specification | DDR 266 | DDR 333 |
|---|---|---|
| $t_{CK}$ | 7.5 ns | 6.0 ns |
| $t_{WR}$ | 15 ns | 12 ns |
| $t_{RP}$ | 15 ns | 18 ns |

Table I lists two different JEDEC Solid State Technology Association (Washington D.C.) double data rate (DDR)

specifications. Table I is meant to be exemplary of the problem solved by the present invention. A DDR specification means data may be written/read on both the rise and fall of a clock pulse. The clock period is $t_{CK}$. The clock frequency of the SDRAM specification is $1/t_{CK}$.

The parameter $t_{WR}$ is defined as the write recovery time, the minimum amount of time that must elapse after a write before a bit line precharge command <PC> may be issued. This timing starts at the first rising clock edge after the last data <D> is coupled to the DRAM I/O pins. Because a <PC> command brings down a word line, $t_{WR}$ determines the minimum internal time $t_{WRT}$, to write a memory cell.

The parameter $t_{RP}$ is defined as the precharge to RAS (row address strobe) time and is the time after a <PC> command which must elapse before a bank activate <BA> command may be issued. Because a <BA> command brings up a word line, $t_{RP}$ determines the minimum internal time $t_{EQL}$, to equalize (precharge) a bitline. The relationship between the <BA> command, the <W> command, the <PC> command, <D>, $t_{WR}$, $t_{RP}$, $t_{WRT}$ and $t_{EQL}$ (as well as a read <R>) command is illustrated in FIG. 2 and described in more detail infra.

While it is straightforward to design a SDRAM that can meet either the DDR 266 or DDR 333 specification separately (i.e. DDR 266: $t_{WR}$=15 ns and tRP=15 ns for $t_{WR}$+$t_{RP}$=30 ns or DDR 333: $t_{WR}$=12 ns and $t_{RP}$=18 ns for $t_{WR}$+$t_{RP}$=30 ns), meeting both specifications outright requires that the SDRAM satisfy the minimum timing of each specification (i.e. $t_{WR}$=12 ns and $t_{RP}$=15 ns, reducing the total $t_{WR}$+$t_{RP}$=30 ns to 27 ns). The result is that the internal timing, $t_{WRT}$ is also reduced by 3 ns. The purpose of the timer lockout circuit 140 in support circuit region 110 of SDRAM 100 is to allow both specifications to be met without a corresponding reduction in tWRT.

Figure 3:
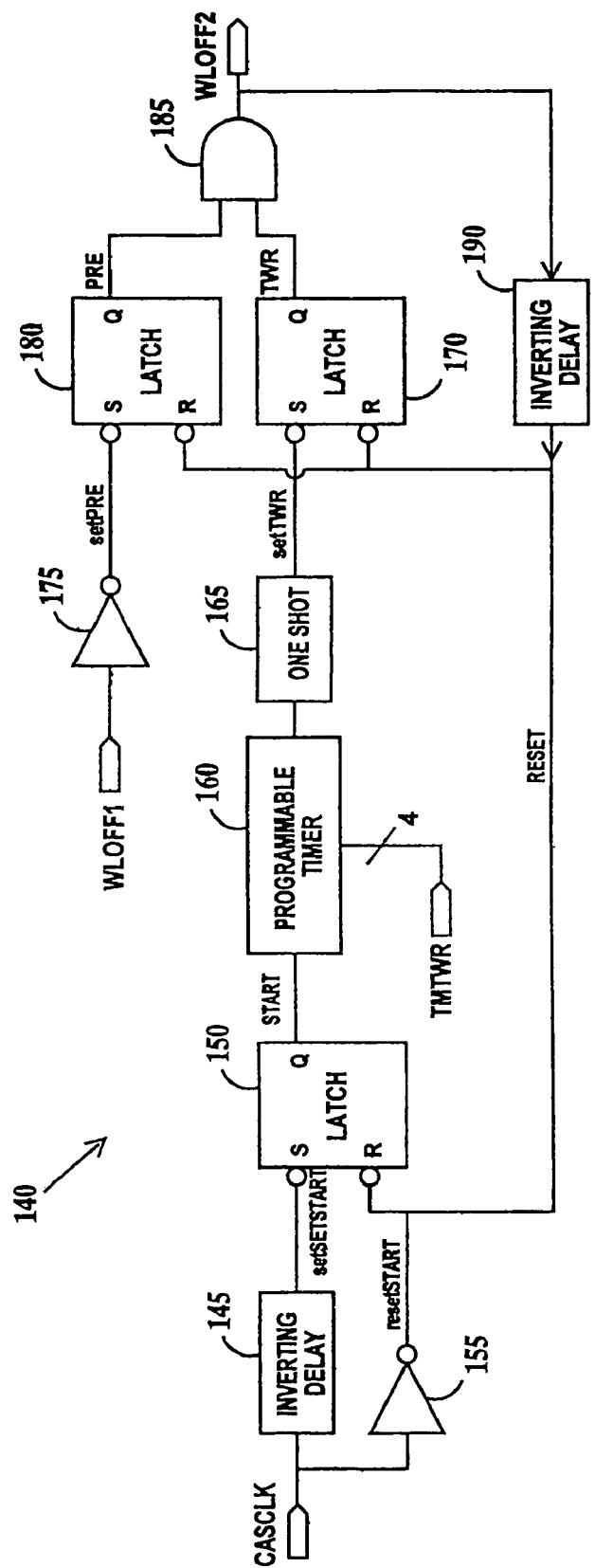
FIG. 3 is a schematic circuit diagram of a timer lockout circuit according to the present invention.

Timer lockout circuit 140 utilizes the normal column address strobe clock (CASCLK) and normal wordline off signal (WLOFF1) to produce a new wordline off signal (WLOFF2) which meets both of the timing specifications shown in Table I. WLOFF1 is generated by a precharge <PC> command. Timer lockout circuit 140 maintains internal timings $t_{WRT}$ and $t_{EQL}$ while requiring only that the sum of the minimum $t_{WR}$ specification and the minimum $t_{RP}$ specification remain constant. This is accomplished by the timer lockout circuit delaying the start of <PC> commands by the difference between the two $t_{WR}$ specifications. This has the effect of trading off "extra" tEQL time for $t_{WRT}$ time. In the example of Table I, the WLOFF2 signal will be issued exactly the same amount of time after the <PC> command (CASCLK) for both DDR 266 and DDR 333 specifications. The result is that the internal $t_{WRT}$ and $t_{EQL}$ timing will also be the same, even though their external counterparts, $t_{WR}$ and $t_{RP}$, are different. Timer lockout circuit 140 is illustrated in FIG. 3 and described in more detail infra.

Figure 2:
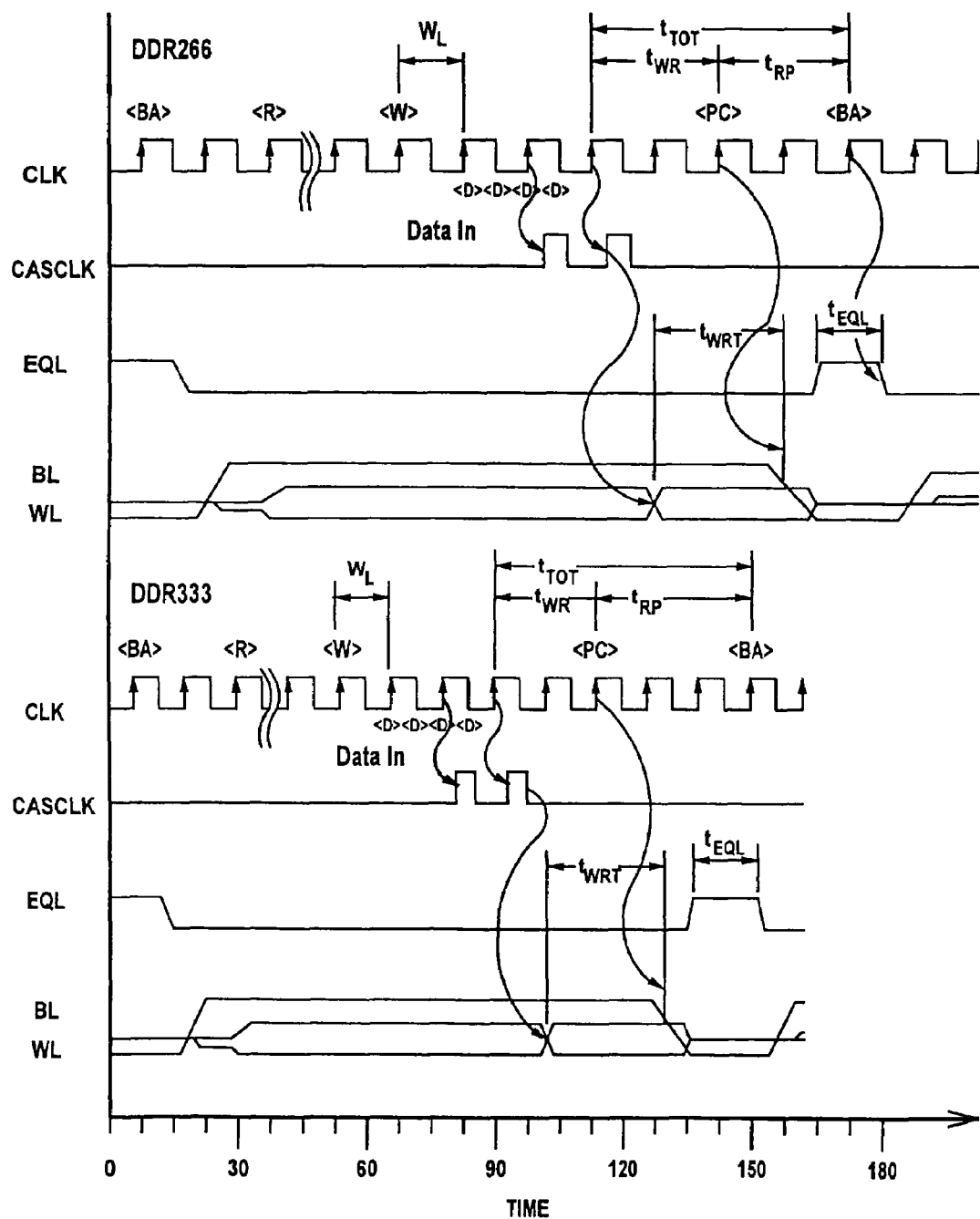
FIG. 2 is a timing diagram of the SDRAM circuit of FIG. 1.

FIG. 2 is a timing diagram of SDRAM 100 of FIG. 1. In FIG. 2, two sets of timings are illustrated. The first set of timings is for the DDR 266 specification and the second set is for the DDR 333 specification. In both sets of timing diagrams after a <W> command, <D> starts to be written onto bitlines one clock cycle later. This is the write latency ($W_L$). Note that a single four-bit data burst is shown as an example only. The number of data bits in the burst (burst length), as well as the number of consecutive bursts may be greater or less than that shown. In the example of FIG. 2, all data is written in groups of two data bits so that one CASCLK pulse is generated every time two bits of data are to be written. Thus, the four bit data burst in FIG. 2 results in two CASCLK pulses. The leading edge of a CASCLK pulse starts the process of writing data. Each time a CASCLK pulse occurs, timer lockout circuit 140 (see FIG. 1 or FIG. 3) will reset and start timing from zero. In the example of FIG. 2, there are two instances of CASCLK. The first instance (or assertion) starts the timer, and the second instance (or re-assertion) resets the timer to zero (i.e. timer lockout circuit 140 of FIG. 1 did not time out). This is important because a write data burst can be interrupted, making it unclear exactly which <D> is the last, and therefore on which CLK edge the $t_{WR}$ timing should begin.

In the DDR 226 specification, the CLK period is 7.5 ns, $t_{WR}$ and $t_{RP}$ are both 2 CLK periods (15 ns) in duration, and $t_{TOT}$ is 4 CLK periods (30 ns) in duration. In the DDR 333 specification the CLK period is 6.0 ns, $t_{WR}$ is 2 CLK periods (12 ns) in duration, $t_{RP}$ is 3 CLK periods (18 ns) in duration, and $t_{TOT}$ is 5 CLK periods (30 ns) in duration. Note however, that the internal timings, $t_{WRT}$ and $t_{EQL}$, are the same for both cases. This is accomplished by timer lockout circuit 140. (see FIG . 3) delaying the end of $t_{WRT}$ relative to <PC> by 3 ns FIG. 3 is a schematic circuit diagram of timer lockout circuit 140 according to the present invention. In FIG. 3, timer lockout circuit includes a first inverting delay 145, a first latch 150, a first inverter 155, a programmable timer 160, a one shot pulse generator 165, a second latch 170, a second inverter 175, a third latch 180, an AND gate 185 and a second inverting delay 190.

First inverting delay 145 and first inverter 155 receive CASCLK and first inverting delay 145 generates a setSTART signal that is coupled to the set input of first latch 150. First inverter 155 generates a resetSTART signal that is coupled to the reset input of first latch 150. First latch 150 generates a START signal that is coupled to one-shot pulse generator 165 through programmable time 160 which delays the START signal by an amount determined by the value of TMTWR signal. In the present example, TMTWR is a four-bit word used to blow (program) fuses or antifuses that set the delay through programmable timer 160. The length of delay through programmable timer 160 is the difference in time between $t_{WR}$ of the DDR 266 specification and the DDR 333 $t_{WR}$ specification, in the present example 3 ns (adjusted for signal delay through first inverting delay 145, first latch 150, and one shot pulse generator 165). Programmable timer 160 will reset to zero and restart timing every time a start signal is received even if timing has previously started and was not completed. One shot pulse generator 165 generates a setTWR signal that is coupled to the set input of second latch 170. WLOFF1 is coupled to the input of second inverter 175. Second inverter 175 generates a setPRE signal coupled to the set input of third latch 180. The output of second latch 170 is a TWR signal and the output of third latch 180 is a PRE signal, which are ANDed together by AND gate 185 to produce WLOFF2. WLOFF2 is coupled to an input of inverting delay 190. The output of inverting delay 190 (a RESET signal) is coupled to the reset inputs of first, second and third latches 150, 170 and 180.

In operation, when CASCLK goes high, resetSTART goes low, resetting first latch 150 and START goes low. After a programmable delay by programmable timer 160, one shot generator 165 pulses setTWR low, second latch 170 sets so TWR goes high. If both PRE and TWR are high, then WLOFF2 is high.

From a SRDAM point of view, since WLOFF1 is derived from the <PC> command when the <PC> command goes high, third latch 180 sets and the PRE signal is presented to AND gate 185. After a data write event (CASCLK pulses) programmable timer 160 times out, setting second latch 170 and TWR is presented to AND gate 185. Thus, when both conditions, WLOFF1 is high and programmable timer 160 times out, WLOFF2 goes high.

IF WLOFF1 goes high after programmable timer 160 times-out (an therefore a sufficient amount of internal write time $t_{WRT}$ has elapsed), then WLOFF2 looks substantially like WLOFF1. However, if the timer has not timed-out (and therefore insufficient write time $t_{WRT}$ has elapsed), then WLOFF2 is a delayed version of WLOFF1 that will allow additional $t_{WRT}$ time. First inverting delay 145 ensures that enough time is allowed to reset programmable timer 160 before the programmable timer must be re-started. Timer lockout circuit 140 essentially times the rise of CASCLK to the end of tWRT and presents that timing as WLOFF2.

Figure 4:
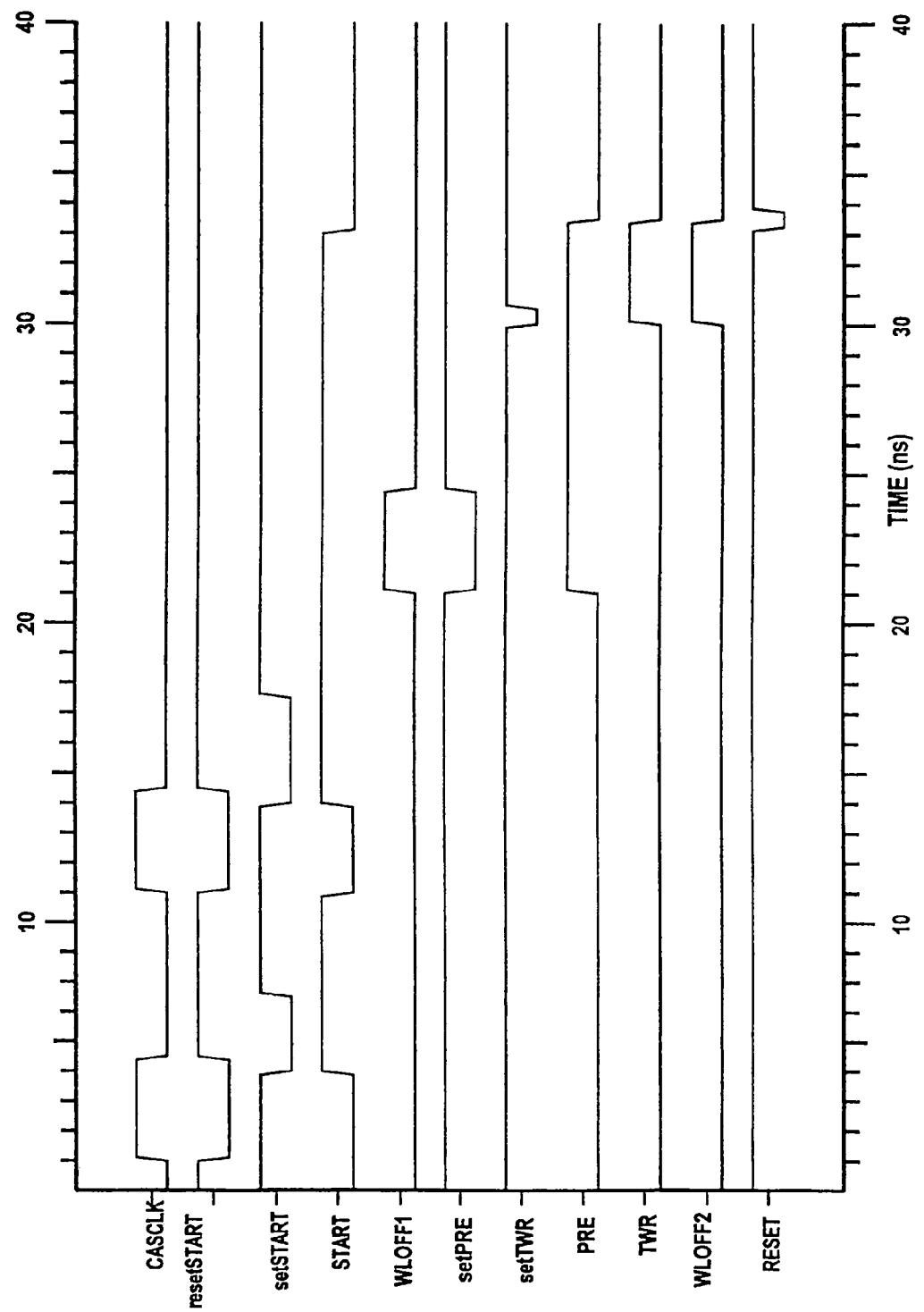
FIG. 4 is a timing diagram of the timer lockout circuit of FIG. 3.

FIG. 4 is a timing diagram of timer lockout circuit 140 of FIG. 3 summarizing the operation of the lockout circuit.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A SDRAM, comprising:
at least one bank of DRAM cells;
said SDRAM operable to a first specification defined by a first clock frequency, a first write recovery time and a first time interval for precharge to row address strobe;
means for programming said SDRAM operable to a second specification defined by a second clock frequency, a second write recovery time and a second time interval for precharge to row address strobe; and
wherein precharging of bitlines in said at least one bank of DRAM cells is delayed by a time interval substantially equal to the difference between said first write recovery time and said second write recovery time.

2. The SDRAM of claim 1, wherein said second write recovery time is less than said first write recovery time.

3. The SDRAM of claim 1, wherein the sum of a minimum internal time to write a DRAM cell of said at least one bank of DRAM cells and a minimum internal time to precharge a bitline connected to said DRAM cell is the same when said SDRAM is operable to said first specification or to said second specification.

4. The SDRAM of claim 1, wherein the sum of said first write recovery time and said first time interval for precharge to row address strobe is equal to the sum of said second write recovery time and said second time interval for precharge to row address strobe.

5. The SDRAM of claim 1, wherein:
said first clock frequency is 1/7.5 nanoseconds, said first write recovery time is 15 nanoseconds and said first time interval for precharge to row address strobe is 15 nanoseconds; and
said second clock frequency is 1/6 nanoseconds, said second write recovery time is 12 nanoseconds and said second time interval for precharge to row address strobe is 18 nanoseconds.

6. A SDRAM comprising:
at least one bank of DRAM coils;
said SDRAM operable to a first write recovery time;
a first circuit for programming said SDRAM operable to a second write recovery time; and a second circuit for delaying the start of a precharge command for a time interval equal to said first write recovery time when said SDRAM is operable to said second write recovery time.

7. The SDRAM of claim 6, wherein said SDRAM is operable to a first specification defined by a first clock frequency, said first write recovery time and a first time interval for precharge to raw address strobe and said SDRAM is operable to a second specification defined by a second clock frequency, said second write recovery time and a second time interval for precharge to row address strobe.

8. The SDRAM of claim 7, wherein said first circuit for programming said SDRAM delays precharging of bitlines in said at least one bank of DRAM cells by a time interval substantially equal to the difference between said first write recovery time and said second write recovery time.

9. The SDRAM of claim 6, wherein said second write recovery time is less than said first write recovery time.

10. The SDRAM of claim 6, wherein said first circuit for programming said SDRAM operable to a second write recovery time comprises:
a first delay circuit for receiving and delaying a first timing signal;
a first latch for receiving a first timing signal from said first delay circuit and for latching said first timing signal, said first timing signal indicating a fixed number of data bits have been written to said at least one bank of DRAM cells;
a programmable timer for receiving said first timing signal from said first latch and for delaying said first timing signal by a programmable time interval;
a one shot pulse generator for receiving said first timing signal from said programmable timer and for generating a set signal;
a second latch for receiving said set signal from said one shot pulse generator and for latching said set signal;
a third latch for receiving a second timing signal and for latching said second timing signal, said second timing signal being a signal to turn off wordlines in said at least one bank of DRAM cells;
a logic gate for receiving said set signal from said second latch, for receiving said second timing signal from said third latch and for generating a third timing signal, said third timing signal being a delayed signal to turn off wordlines in said at least one bank of DRAM cells; and
a second delay circuit for receiving and delaying said third timing signal and for simultaneously resetting said first latch, said second latch and said third latch after delaying said third timing signal.

11. The SDRAM of claim 10, wherein said programmable timer resets to zero elapsed time upon de-assertion of said first timing signal if said programmable interval has not been reached prior to said de-assertion or said first timing signal.

12. The SDRAM of claim 10, wherein said programmable time interval is determined by a digital signal changing the state of fines or antifuses.

13. The SDRAM of claim 10, further including an inverter for receiving said first timing signal, inverting said first timing signal and for applying said inverted timing signal to a reset input of said first latch.

14. The SDRAM of claim 10, wherein said second delay circuit applies said third timing signal to reset inputs of said first, second and third latches.

15. The SDRAM of claim 10, wherein said logic gate is an AND gate.

16. A SDRAM comprising:
at least one bank of DRAM cells;

said SDRAM operable to a first specification defined by a first clock frequency, a first write recovery time and a first time interval for precharge to row address strobe;

said SDRAM operable to a second specification defined by a second clock frequency, a second write recovery time and a second time interval for precharge to row address strobe;

a programmable circuit adapted to control operation of said SDRAM based on said first and said second write recovery times;

wherein precharging of bitlines in said at least one bank of DRAM cells is delayed by a time interval substantially equal to the difference between said first write recovery time and said second write recovery time.

17. The SDRAM of claim 16, wherein said second write recovery time is less than said first write recovery time.

18. The SDRAM of claim 16, wherein said SDRAM is operable to the sum of the minimum of said first and second write recovery times and the minimum of said first and second time intervals for precharge to row address strobe.

19. The SDRAM or claim 16, wherein the sum of said first write recovery time and said first time interval for precharge to row address strobe is equal to the sum of said second write recovery time and said second time interval for precharge to row address strobe.

20. The SDRAM of claim 16, wherein:

said first clock frequency is 1/7.5 nanoseconds, said first write recovery time is 15 nanoseconds and said first time interval for precharge to row address strobe is 15 nanoseconds; and said second clock frequency is 1/6 nanoseconds, said second write recovery time is 12 nanoseconds and said second time interval for precharge to row address strobe is 18 nanoseconds.

* * * * *

UNITED STATES PATENT AND TRADEMARK OFFICE
CERTIFICATE OF CORRECTION

PATENT NO.        : 7,068,564 B2                                    Page 1 of 1
APPLICATION NO. : 10/604168
DATED             : June 27, 2006
INVENTOR(S)       : Jacunski et al.

It is certified that error appears in the above-identified patent and that said Letters Patent is hereby corrected as shown below:

Column 3
Lines 24 and 25, delete "266" and insert -- 226 --
Line 25, delete "tRP" and inset -- $t_{RP}$ --
Lines 25, 26, 27, 29, there should be a single space instead of a double or a triple space between the numerals and "ns".

Column 5
Line 65, delete "coils" and insert -- cells --

Signed and Sealed this

Twenty-first Day of August, 2007

JON W. DUDAS
*Director of the United States Patent and Trademark Office*